(12) United States Patent
Ankoudinov et al.

(10) Patent No.: US 8,421,118 B2
(45) Date of Patent: Apr. 16, 2013

(54) REGENERATIVE BUILDING BLOCK AND DIODE BRIDGE RECTIFIER AND METHODS

(75) Inventors: Alexei Ankoudinov, Redmond, WA (US); Vladimir Rodov, Seattle, WA (US)

(73) Assignee: STMicroelectronics N.V., Amsterdam (NL)

( * ) Notice: Subject to any disclaimer, the term of this patent is extended or adjusted under 35 U.S.C. 154(b) by 0 days.

(21) Appl. No.: 12/359,094

(22) Filed: Jan. 23, 2009

(65) Prior Publication Data

US 2009/0185404 A1 Jul. 23, 2009

Related U.S. Application Data

(63) Continuation of application No. 12/238,308, filed on Sep. 25, 2008, now Pat. No. 8,148,748.

(60) Provisional application No. 61/022,968, filed on Jan. 23, 2008, provisional application No. 60/975,467, filed on Sep. 26, 2007, provisional application No. 61/022,968, filed on Jan. 23, 2008.

(51) Int. Cl.
*H01L 29/66* (2006.01)
*H01L 21/332* (2006.01)

(52) U.S. Cl.
USPC .......... 257/124; 257/119; 257/126; 257/127; 257/130; 257/133; 257/138; 438/134; 438/135; 438/136; 438/137; 438/138; 438/140; 363/126; 363/127; 363/128

(58) Field of Classification Search .......... 363/126–128; 257/107, 119, 126, 127, 130, 133, 138; 327/574; 438/134–138, 140
See application file for complete search history.

(56) References Cited

U.S. PATENT DOCUMENTS

| 3,602,777 A | 8/1971 | Berman |
| 3,603,811 A | 9/1971 | Day et al. |

(Continued)

FOREIGN PATENT DOCUMENTS

| EP | 0322400 A2 | 6/1989 |
| EP | 0 807 979 A2 | 11/1997 |

(Continued)

OTHER PUBLICATIONS

Office Action dated Sep. 16, 2009 from U.S. Appl. No. 12/238,308.

(Continued)

*Primary Examiner* — Matthew W Such
*Assistant Examiner* — Jeremy Joy
(74) *Attorney, Agent, or Firm* — Wolf, Greenfield & Sacks, P.C.

(57) ABSTRACT

A rectifier building block has four electrodes: source, drain, gate and probe. The main current flows between the source and drain electrodes. The gate voltage controls the conductivity of a narrow channel under a MOS gate and can switch the RBB between OFF and ON states. Used in pairs, the RBB can be configured as a three terminal half-bridge rectifier which exhibits better than ideal diode performance, similar to synchronous rectifiers but without the need for control circuits. N-type and P-type pairs can be configured as a full bridge rectifier. Other combinations are possible to create a variety of devices.

47 Claims, 19 Drawing Sheets

U.S. PATENT DOCUMENTS

| | | | |
|---|---|---|---|
| 4,281,448 A | | 8/1981 | Barry et al. |
| 4,373,252 A | | 2/1983 | Caldwell |
| 4,533,970 A | | 8/1985 | Brown |
| 4,599,576 A | | 7/1986 | Yoshida et al. |
| 4,610,730 A | | 9/1986 | Harrington et al. |
| 4,630,084 A | * | 12/1986 | Tihanyi .................. 257/342 |
| 4,722,856 A | | 2/1988 | Albrecht et al. |
| 4,783,348 A | | 11/1988 | Albrecht et al. |
| 4,843,441 A | | 6/1989 | Willard |
| 4,903,189 A | | 2/1990 | Ngo et al. |
| 4,955,069 A | * | 9/1990 | Ionescu ..................... 388/811 |
| 4,962,411 A | | 10/1990 | Tokura et al. |
| 4,967,243 A | | 10/1990 | Baliga et al. |
| 4,969,028 A | | 11/1990 | Baliga |
| 4,982,260 A | | 1/1991 | Chang et al. |
| 4,996,581 A | | 2/1991 | Hamasaki |
| 5,019,530 A | | 5/1991 | Kleinsasser et al. |
| 5,021,861 A | | 6/1991 | Baliga |
| 5,070,377 A | | 12/1991 | Harada |
| 5,111,253 A | | 5/1992 | Korman et al. |
| 5,304,831 A | | 4/1994 | Yilmaz et al. |
| 5,381,025 A | * | 1/1995 | Zommer ..................... 257/138 |
| 5,387,805 A | | 2/1995 | Metzler et al. |
| 5,396,085 A | | 3/1995 | Baliga |
| 5,410,171 A | * | 4/1995 | Tsuzuki et al. ............ 257/337 |
| 5,416,354 A | | 5/1995 | Blackstone |
| 5,430,315 A | | 7/1995 | Rumennik |
| 5,446,295 A | | 8/1995 | Whitney |
| 5,532,502 A | | 7/1996 | Seki |
| 5,545,573 A | | 8/1996 | Narazaki et al. |
| 5,554,880 A | | 9/1996 | Metzler et al. |
| 5,559,355 A | | 9/1996 | Yamazaki et al. |
| 5,621,234 A | | 4/1997 | Kato |
| 5,629,536 A | | 5/1997 | Heminger et al. |
| 5,643,809 A | | 7/1997 | Lien |
| 5,719,411 A | | 2/1998 | Ajit |
| 5,742,463 A | | 4/1998 | Harris |
| 5,744,994 A | | 4/1998 | Williams |
| 5,747,841 A | | 5/1998 | Ludikhuize |
| 5,751,025 A | | 5/1998 | Heminger et al. |
| 5,818,084 A | * | 10/1998 | Williams et al. ............ 257/329 |
| 5,825,079 A | | 10/1998 | Metzler et al. |
| 5,869,380 A | | 2/1999 | Chang |
| 5,877,515 A | | 3/1999 | Ajit |
| 5,886,383 A | | 3/1999 | Kinzer |
| 5,898,982 A | | 5/1999 | Metzler et al. |
| 5,929,690 A | | 7/1999 | Williams |
| 5,932,922 A | | 8/1999 | Metzler et al. |
| 5,956,582 A | | 9/1999 | Ayela et al. |
| 6,034,385 A | | 3/2000 | Stephani et al. |
| 6,048,788 A | | 4/2000 | Huang et al. |
| 6,051,850 A | * | 4/2000 | Park ......................... 257/133 |
| 6,078,074 A | | 6/2000 | Takebuchi et al. |
| 6,097,046 A | | 8/2000 | Plumton |
| 6,100,145 A | | 8/2000 | Kepler et al. |
| 6,169,300 B1 | * | 1/2001 | Fragapane ................ 257/146 |
| 6,172,398 B1 | | 1/2001 | Hshieh |
| 6,186,408 B1 | | 2/2001 | Rodov et al. |
| 6,225,280 B1 | | 5/2001 | Dokter et al. |
| 6,235,601 B1 | | 5/2001 | Kim |
| 6,242,324 B1 | | 6/2001 | Kub et al. |
| 6,258,634 B1 | | 7/2001 | Wang et al. |
| 6,268,758 B1 | * | 7/2001 | Limmer et al. ............. 327/424 |
| 6,281,547 B1 | | 8/2001 | So et al. |
| 6,313,001 B1 | | 11/2001 | Johansson et al. |
| 6,323,091 B1 | | 11/2001 | Lee et al. |
| 6,331,455 B1 | | 12/2001 | Rodov et al. |
| 6,362,036 B1 | | 3/2002 | Chiozzi et al. |
| 6,373,097 B1 | | 4/2002 | Werner |
| 6,384,456 B1 | | 5/2002 | Tihanyi |
| 6,399,996 B1 | | 6/2002 | Chang et al. |
| 6,404,033 B1 | | 6/2002 | Chang et al. |
| 6,420,225 B1 | * | 7/2002 | Chang et al. ............... 438/237 |
| 6,426,541 B2 | | 7/2002 | Chang et al. |
| 6,448,160 B1 | | 9/2002 | Chang et al. |
| 6,459,108 B1 | * | 10/2002 | Bartsch et al. ............. 257/263 |
| 6,476,442 B1 | | 11/2002 | Williams et al. |
| 6,498,367 B1 | | 12/2002 | Chang et al. |
| 6,515,330 B1 | | 2/2003 | Hurtz et al. |
| 6,537,860 B2 | | 3/2003 | Akiyama et al. |
| 6,624,030 B2 | | 9/2003 | Chang et al. |
| 6,630,698 B1 | * | 10/2003 | Deboy et al. ................... 257/285 |
| 6,653,740 B2 | | 11/2003 | Kinzer et al. |
| 6,724,039 B1 | | 4/2004 | Blanchard |
| 6,743,703 B2 | | 6/2004 | Rodov et al. |
| 6,765,264 B1 | | 7/2004 | Chang et al. |
| 6,784,489 B1 | | 8/2004 | Menegoli |
| 6,828,605 B2 | | 12/2004 | Eisele et al. |
| 6,853,036 B1 | | 2/2005 | Rodov et al. |
| 6,897,682 B2 | * | 5/2005 | Nadd ............................... 326/83 |
| 6,956,266 B1 | | 10/2005 | Voldman et al. |
| 6,967,374 B1 | | 11/2005 | Saito et al. |
| 6,979,861 B2 | | 12/2005 | Rodov et al. |
| 6,992,353 B1 | | 1/2006 | Wu |
| 7,009,253 B2 | | 3/2006 | Rodov et al. |
| 7,087,981 B2 | * | 8/2006 | Kapels et al. ................. 257/610 |
| 7,095,113 B2 | | 8/2006 | Xiaochun et al. |
| 7,220,319 B2 | | 5/2007 | Sago et al. |
| 7,250,668 B2 | | 7/2007 | Chang et al. |
| 7,264,999 B2 | | 9/2007 | Xiaochun et al. |
| 7,342,389 B1 | | 3/2008 | Wu et al. |
| RE40,222 E | | 4/2008 | Fragapane |
| 7,781,826 B2 | * | 8/2010 | Mallikararjunaswamy et al. ............................... 257/328 |
| 7,893,489 B2 | | 2/2011 | Kobayashi |
| 8,148,748 B2 | * | 4/2012 | Ankoudinov et al. ......... 257/124 |
| 2001/0045635 A1 | | 11/2001 | Kinzer et al. |
| 2002/0019115 A1 | | 2/2002 | Rodov et al. |
| 2002/0024375 A1 | * | 2/2002 | Asano et al. ................... 327/365 |
| 2002/0177324 A1 | | 11/2002 | Metzler |
| 2003/0025152 A1 | * | 2/2003 | Werner et al. ................. 257/328 |
| 2003/0146474 A1 | | 8/2003 | Ker et al. |
| 2003/0207538 A1 | | 11/2003 | Hshieh et al. |
| 2003/0222290 A1 | * | 12/2003 | Rodov et al. ................... 257/282 |
| 2004/0041619 A1 | | 3/2004 | Nadd |
| 2005/0029585 A1 | | 2/2005 | He et al. |
| 2005/0116313 A1 | | 6/2005 | Lee et al. |
| 2005/0152080 A1 | * | 7/2005 | Harris et al. ..................... 361/56 |
| 2005/0189626 A1 | | 9/2005 | Xiaochun et al. |
| 2005/0189658 A1 | | 9/2005 | Xiaochun et al. |
| 2005/0200384 A1 | * | 9/2005 | Nadd ............................... 326/83 |
| 2005/0200394 A1 | * | 9/2005 | Underwood et al. ......... 327/292 |
| 2005/0231355 A1 | * | 10/2005 | Hair et al. ..................... 340/538 |
| 2005/0243496 A1 | | 11/2005 | Harris |
| 2006/0097323 A1 | | 5/2006 | Rodov et al. |
| 2006/0098363 A1 | | 5/2006 | Hebert et al. |
| 2006/0098364 A1 | | 5/2006 | Harris et al. |
| 2006/0098373 A1 | | 5/2006 | Hebert et al. |
| 2006/0145260 A1 | | 7/2006 | Kim |
| 2006/0158812 A1 | | 7/2006 | Harris |
| 2006/0158816 A1 | | 7/2006 | Harris et al. |
| 2006/0176638 A1 | | 8/2006 | Coates |
| 2006/0244060 A1 | * | 11/2006 | Kapels et al. ................. 257/341 |
| 2006/0250736 A1 | | 11/2006 | Harris |
| 2006/0285264 A1 | | 12/2006 | Harris |
| 2007/0235752 A1 | | 10/2007 | Rodov et al. |
| 2007/0246794 A1 | | 10/2007 | Chang et al. |
| 2008/0017930 A1 | | 1/2008 | Kim et al. |
| 2008/0079035 A1 | | 4/2008 | Bobde |
| 2008/0137249 A1 | | 6/2008 | Harris |
| 2008/0192394 A1 | | 8/2008 | Harris |
| 2008/0265975 A1 | * | 10/2008 | Takasu et al. ................. 327/374 |
| 2008/0284383 A1 | | 11/2008 | Aas et al. |
| 2009/0026492 A1 | | 1/2009 | Chatty et al. |

FOREIGN PATENT DOCUMENTS

| | | | |
|---|---|---|---|
| JP | 04-343260 A | 11/1992 | |
| JP | 05082534 A | 4/1993 | |
| JP | 05175206 A | 7/1993 | |
| JP | 06061250 A | 3/1994 | |
| JP | 06112149 A | 4/1994 | |
| JP | 08-017933 A | 1/1996 | |

OTHER PUBLICATIONS

Office Action dated Sep. 21, 2009 from U.S. Appl. No. 12/431,580.
Final Office Action dated Dec. 8, 2010 from U.S. Appl. No. 12/431,580.

Extended European Search Report dated Jan. 5, 2011 from European Application No. 09813383.8.

International Search Report dated Mar. 10, 2009 from International Application No. PCT/US2009/031885.

Written Opinion of the International Searching Authority dated Mar. 10, 2009 from International Application No. PCT/US2009/031885.

International Search Report dated Dec. 4, 2008 from International Application No. PCT/US2008/077747.

International Search Report dated Aug. 16, 2010 from International Application PCT/US2010/020284.

International Search Report dated Dec. 20, 2010 from International Application PCT/US2010/033451.

International Search Report dated Jun. 19, 2009 from International Application PCT/US2009/041996.

Written Opinion of the International Searching Authority dated Jun. 19, 2009 from International Application PCT/US2009/041996.

Office Action from U.S. Appl. No. 12/238,308 dated Mar. 3, 2011.

Office Action from U.S. Appl. No. 12/683,425 dated Dec. 27, 2011.

Ankudinov, A. et al, "High injection regime of the super barrier(TM) rectifier," Solid-State Electronics, vol. 51, No. 5, pp. 714-718.

Ankudinov, A. et al. "Electrostatic force microscopy study of the electric field distribution in semiconductor laser diodes under applied biases," 9th Int. Symp. "Nanostructures: Physics and Technology," St. Petersburg, Russia, Jun. 18-22, 2001, pp. 198-201.

Ankudinov, A. et al., "Fine Structure of the Inner Electric Field in Semiconductor Laser Diodes Studied by EFM," Phys. Low-Dim. Struct., 3/4, 2001, pp. 9-16.

Ankudinov, A. et al., "Study of high power GaAs-based laser diodes operation and failure by cross-sectional electrostatic force microscopy," 10th Int. Symp. Nanostructures: Physics and Technology, Jun. 17-21, 2002, St. Petersburg, Russia, pp. 143-145.

Bashirov, A.M. et al., "Switching of thyristors using the dU/dt effect," Radiotekhnika i Elektronika, vol. 14, No. 2, USSR, Feb. 1969, pp. 374-375.

Bixby, B. et al., "Application Considerations for Very High Speed Fast Recovery Power Diodes," IEEE, IAS 1977 Annual, pp. 1023-1027.

Chelnokov, E. et al, "Effect of moving charge carriers in a collector junction of p-n-p-n structure on the switching on process," Radiotekhnika I Elektronika, v 16, USSR, 1971, pp. 1039-1046.

Christiansen, B. "Synchronous Rectification," PCIM, Aug. 1998.

Hikin, B. et al., "Reverse Recovery Process with Non-Uniform Lifetime Distribution in the Base of a Diode," IEEE, IAS 1977 Annual, pp. 644-647.

Huth, G., "Study of the Spatial Characteristics of the Breakdown Process in Silicon PN-Junctions," Proc. of the 2nd Int. Conf. on Transmutation Doping in Semiconductors, University of Missouri, Columbia, MO, Apr. 23-26, 1978, pp. 91-108.

Kuz'min, V.A. et al., "P-N-P-N-Structures Turning on At High-Voltage and High-Current Density," Radiotekhnika I Elektronika, vol. 20, No. 7, USSR, 1975, pp. 1457-1465.

Kuz'min, V.A. et al., "The turn-on process of p-n-p-n structures at high voltages and a high current density," Radiotekhnika I Elektronika, vol. 20, No. 8, USSR, Aug. 1975, pp. 1710-1714.

Kuz'min, V.A. et al., "Turn-on of a p-n-p-n structure at a high current density," Radiotekhnika i Elektronika, vol. 18, No. 1, USSR, Jan. 1973.

Lorenz, L. et al., "Improved MOSFET, An Important Milestone Toward a New Power MOSFET Generation," PCIM, Sep. 1993.

Melnik, Y. et al., "HVPE GaN and AlGaN "Substrates" for Homoepitaxy," Materials Science Forum, vols. 164-268, 1998, pp. 1121-1124.

Molibog, N.P. et al., "The effect of mobile charge carriers in the collector junction of a p-n-p-n structure on the turn-on process," Radiotekhnika i Elektronika, vol. 16, No. 6, USSR, Jun. 1971, pp. 1039-1046.

Office Action from U.S. Appl. No. 12/431,580, dated May 9, 2012.

Pavlik, V.Y. et al., "The I-V characteristic of a p-n-p-n structure in the 'On' state for high residual voltages," Radiotekhnika i Elektronika, vol. 18, No. 7, USSR, Jul. 1974.

Rodov, V. et al, "Super barrier rectifier—a new generation of power diode," IEEE Transactions on Industry Applications, vol. 44, No. 1, pp. 234-237.

Rodov, V.I. et al., "Calculation of the Current-Voltage characteristic of an unsaturated p-n-p-n structure," Radiotekhnika i Elektronika, vol. 19, No. 6, USSR, Jun. 1974, pp. 1325-1326.

Rodov, V.I., "Non-one-dimensional processes in p-n-p-n structures," Poluprovodnikovye Pribory i ikh Primenenie, No. 28, USSR, 1974, pp. 3-22.

Vemulapati, U. et al., "The Concept of a Regenerative Diode", IEEE, 2007, pp. 193-196.

Office Action from U.S. Appl. No. 12/683,425, dated Jun. 20, 2012.

Office Action from U.S. Appl. No. 13/398,591 dated Jul. 26, 2012.

Extended European Search Report from related European Patent Application No. 09739614.7, dated Nov. 12, 2012.

Office Action from U.S. Appl. No. 12/773,003 dated Dec. 6, 2012.

* cited by examiner

Figure 3 -- Regenerative half-bridge, Static simulation

Figure 4 -- Regenerative Half bridge: Forward voltage drop vs current N-type (red); P-type (green); Ideal diode (blue for $I_R=10\mu A$)

Figure 6 -- Regenerative Half-bridge Transient for Current Doubler Rectification Design Forward and reverse recovery in regenerative half-bridge
Red-Voltage
Green-Current Reverse recovery: Trr<25ns

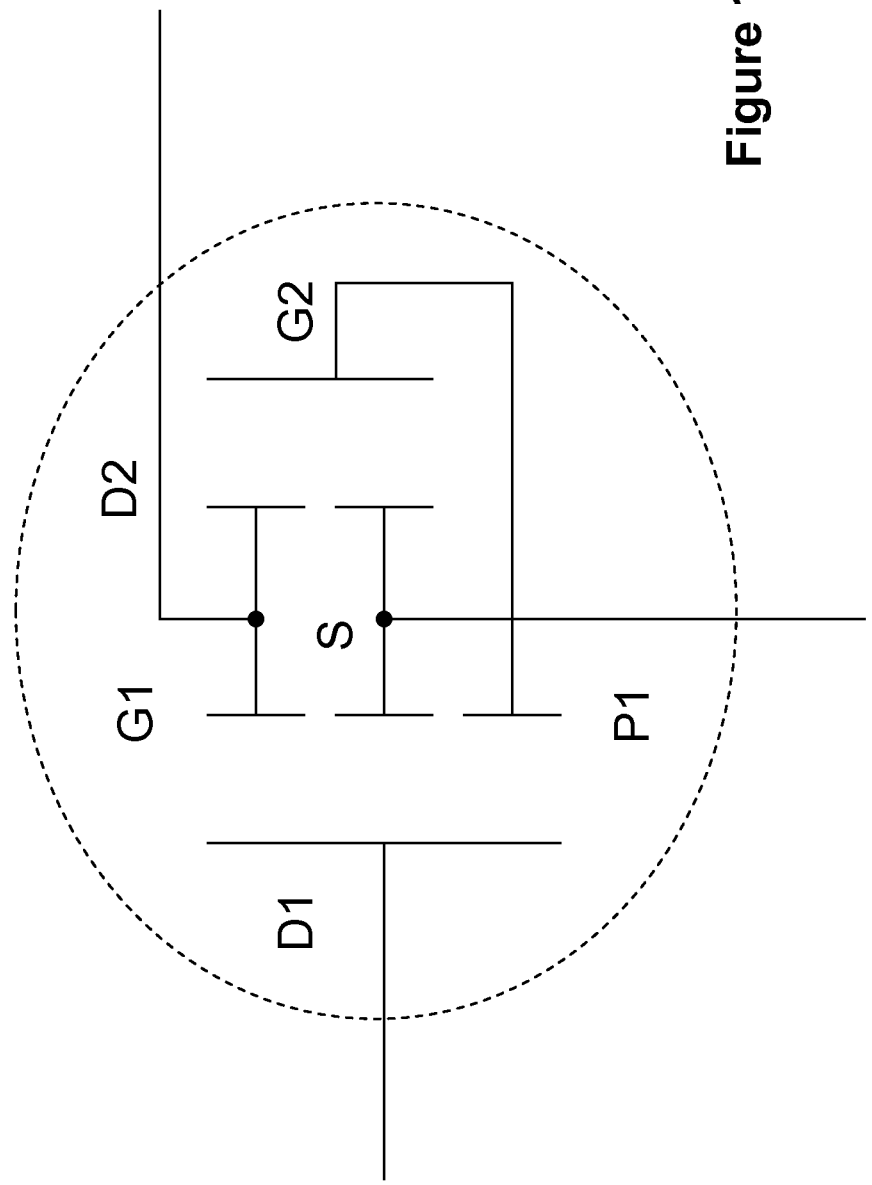
Figure 19

# REGENERATIVE BUILDING BLOCK AND DIODE BRIDGE RECTIFIER AND METHODS

RELATED APPLICATIONS

This application is related to, and claims the benefit of U.S. Provisional Patent Application Ser. No. 61/022,968, filed Jan. 23, 2008, as well as U.S. patent application Ser. No. 12/238,308, filed Sep. 25, 2008, and, through it, claims the benefit of U.S. Provisional Patent Application Ser. No. 60/975,467, filed Sep. 26, 2007, entitled Adjustable Field Effect Rectifier, and commonly assigned.

FIELD OF THE INVENTION

The present invention relates generally to semiconductor rectifiers, and more specifically to a regenerative self-controlling mechanism for improving the performance of diode bridges, and methods therefor.

BACKGROUND OF THE INVENTION

Diode bridges, either full or half bridges, are very common circuit elements to perform rectification of oscillating output signal. A half bridge is made of two diodes and has three external electrodes. They are commonly used for the output rectification in switched-mode power supply circuits: e.g. in forward, push-pull, half bridge and full bridge topologies. For one polarity of the signal, electric current flows through one diode (in ON state) and not through the other (in OFF state). For the opposite polarity the diodes switch their states: the ON diode goes to OFF state and the OFF diode changes to ON state. This switching of the current flow between the two diodes results in rectification.

The energy loss during signal rectification is determined by the performance of individual diode. For the real diode implementation, it is limited by the ideal diode equation:

$$I_F/I_R \leq \exp(qV_F/kT)$$

where $I_F$ is a forward current, $V_F$ is the forward bias voltage, $I_R$ is the leakage current and $kT/q=0.0259V$ at room temperature T. Thus a certain rectification ratio requires that the forward voltage drop is larger than some limit $$V_F > 0.0259 \ln(1+I_F/I_R)$$

For example, for a diode conducting a current of 10 A, with 10 μA leakage current, the forward voltage drop is larger than 0.358. Some diodes are close to this theoretical limit, leaving very small space for improvement through conventional techniques. This theoretical limit leads to very inefficient diodes once the electronics moves to lower voltages. For example, if a power supply uses 3.3V the losses on the half bridge will be about 0.358/3.3=11%. This high energy loss just for the rectification is unacceptable for modern switched-mode power supplies.

To overcome the high losses on rectifier bridges for low voltage applications, synchronous rectification is used. One approach is to use a MOSFET to perform the rectification function of the diode. However, the circuit implementation of synchronous rectification becomes very complicated. A controller is needed to provide the gate voltage and to change MOSFET from the ON to the OFF state. Sensors are needed to tell the controller that the sign of the applied voltage has changed. This additional signal processing reduces the speed of operation for half bridges made of synchronous rectifiers. Thus instead of 2 diodes, one needs a much more complicated and expensive circuit.

Thus, there has been a long-felt need for a bridge rectifier which can operate efficiently at low voltages, but without the complex circuitry and limited frequency range of conventional synchronous rectifiers.

SUMMARY OF THE INVENTION

A regenerative building block (RBB) is proposed as a new semiconductor device, which in particular can be used in pairs to make efficient diode half bridges capable of operating at low voltages without unacceptable loss. Each RBB has 4 electrodes: source, drain, gate and probe. In an embodiment, the current between the source and drain of each RBB can be controlled by the gate voltage. The probe electrode of the first RBB provides the regenerative signal for the gate electrode of the second RBB. This signal from the probe electrode can be used to switch an adjacent semiconductor device, forming the second device of the pair, between ON and OFF states. Thus, a half bridge made with a pair of RBB's in accordance with the invention has only three external contacts. An embodiment of a half bridge having a common anode or common cathode made from two RBB's exhibits better than ideal diode performance similar to synchronous rectifiers. Since the half bridge requires only three contacts, the control signal complexity of conventional synchronous rectifiers is avoided.

THE FIGURES

FIG. 1 illustrates in schematic form a 4-terminal regenerative building block (RBB) structure. The current flow between source and drain is controlled by the gate electrode. The Probe electrode can be used as additional current control or as a source of regenerative signal.

FIG. 2 illustrates two RBB's as shown in FIG. 1 combined to form a regenerative half bridge. The Probe electrode of each RBB is connected to the Gate electrode of the other RBB for automatic switching between ON and OFF states. In an embodiment, two n-type (p-type) RBB's will make a common anode (common cathode) regenerative half bridge.

FIG. 3 illustrates common anode and common cathode half bridges combined into a full diode bridge. Current flow is shown by arrows.

FIG. 4 graphically depicts forward voltage drop vs. applied current. Common anode (red) and common cathode (green) half bridges have a smaller voltage drop than the ideal diode (blue) with 20 uA leakage.

Figure 7:
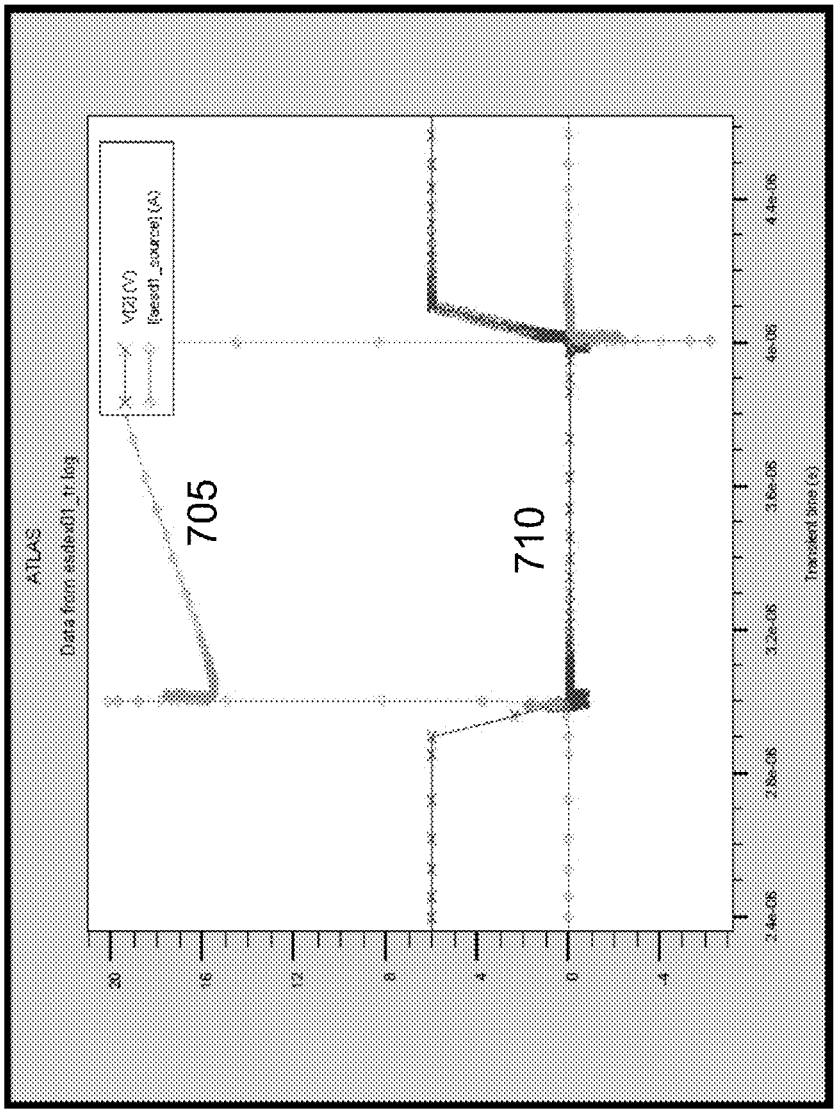

FIG. 7 show current (green) and voltage (red) waveforms for a current doubler constructed in accordance with an aspect the invention. Forward recovery happens at 3 μs, and reverse recovery at 4 μs. The forward voltage drop in the middle is 0.05V.

Figure 8:
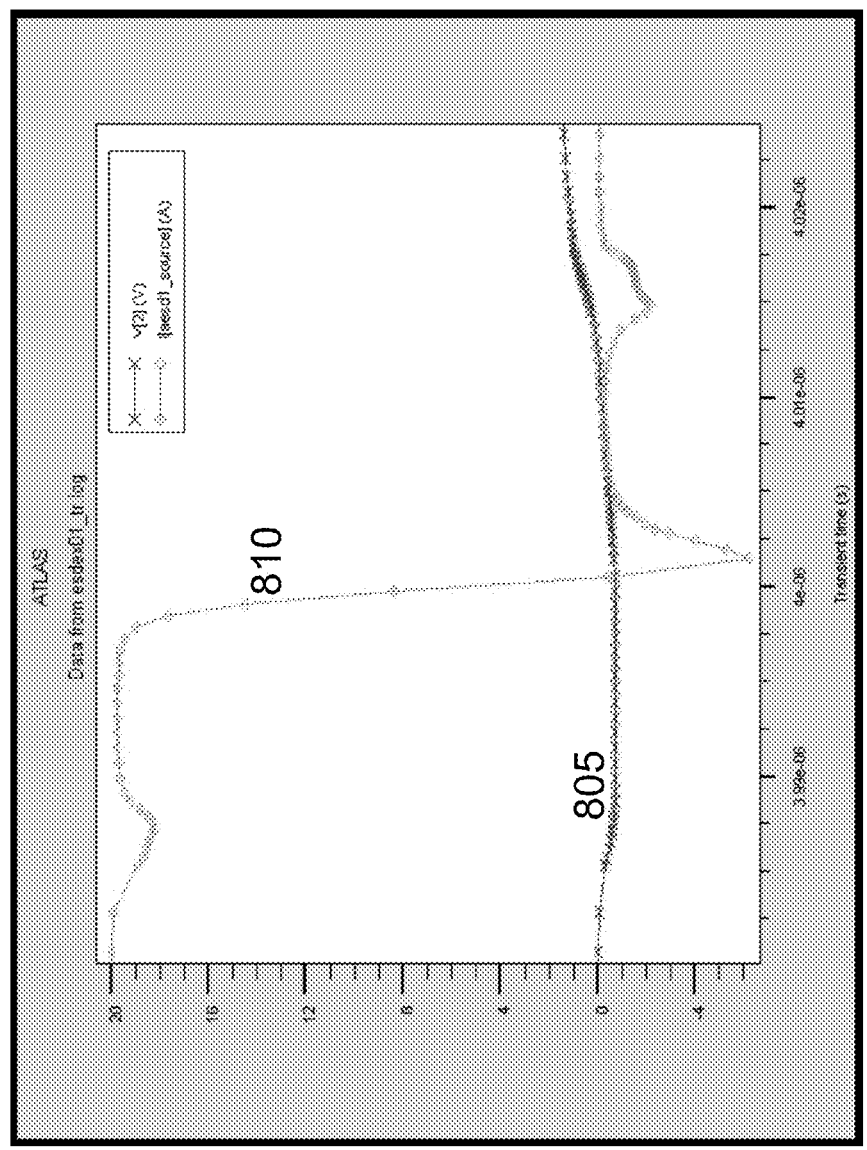

FIG. 8 depicts reverse recovery for a regenerative half bridge in accordance with the invention. The first negative peak corresponds to the transition of the RBB from ON to OFF state. The second negative peak corresponds to the transition of the adjacent RBB from OFF to ON state, when the voltage on the first RBB is big enough to switch it ON.

Figure 9:
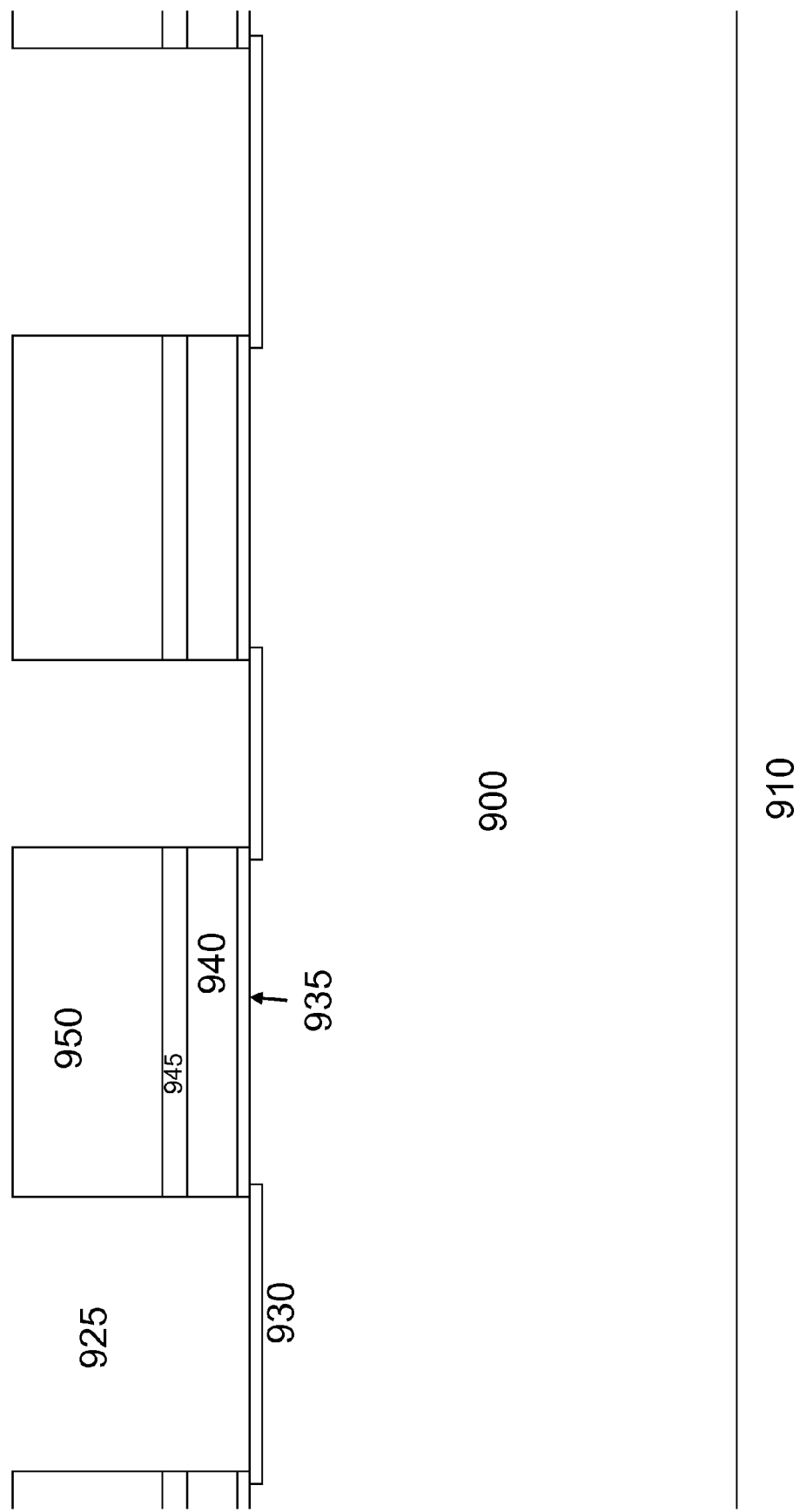

FIG. 9 depicts a semiconductor structure according to an embodiment of the process of the invention, after vertical etching through insulating oxide, polysilicon gate and gate oxide (can leave some of gate oxide to reduce the channeling) using the Gate mask. Contact As implant has been made for source and probe electrodes.

Figure 10:
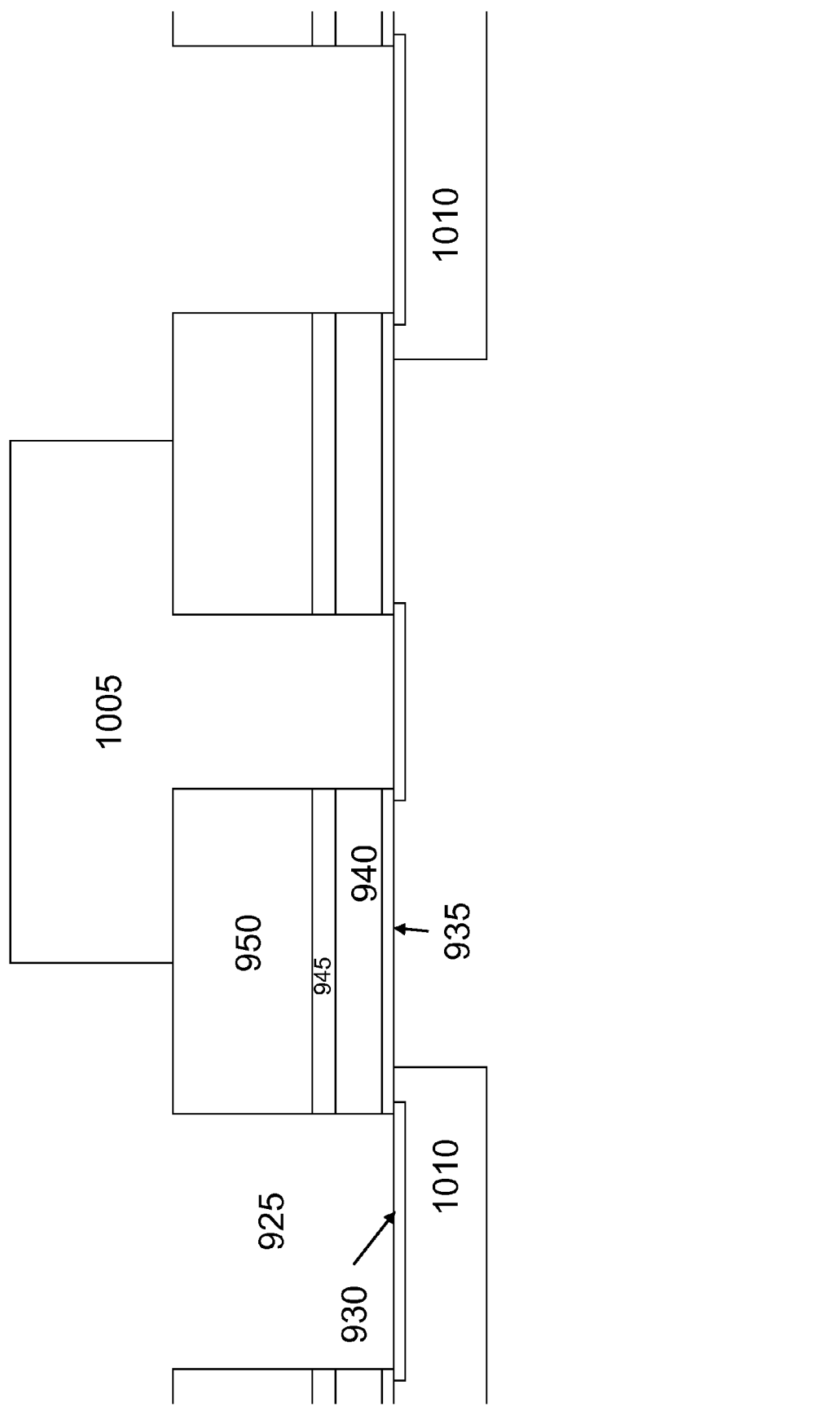

FIG. 10 illustrates a semiconductor structure after a probe mask is placed on the Gate mask to cover the Probe contact opening and the P-well boron implant has been made.

Figure 11:
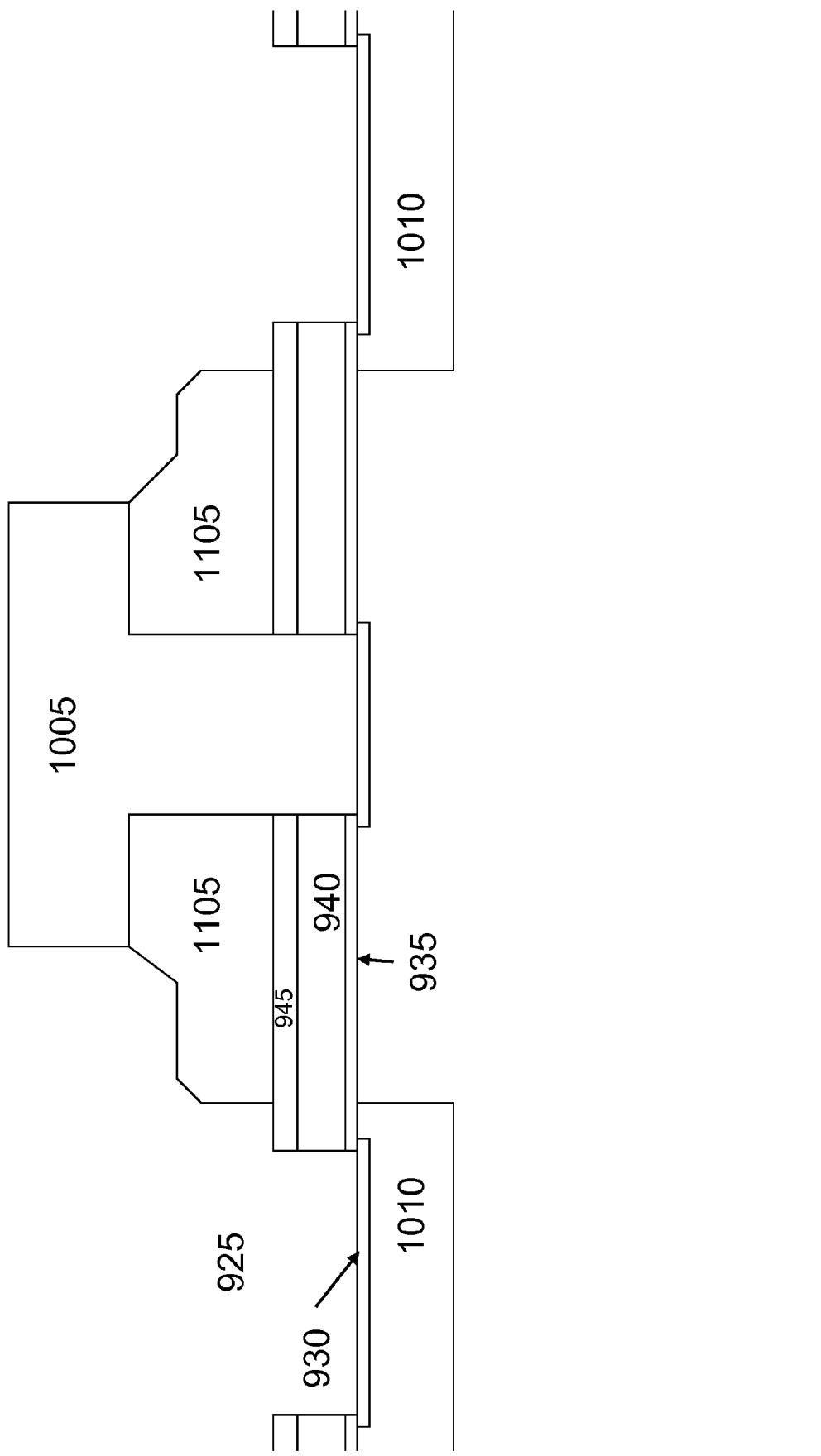

FIG. 11 illustrates the semiconductor after isotropic ashing of the photoresist has been made to provide self-aligning mask for the next step.

Figure 12:
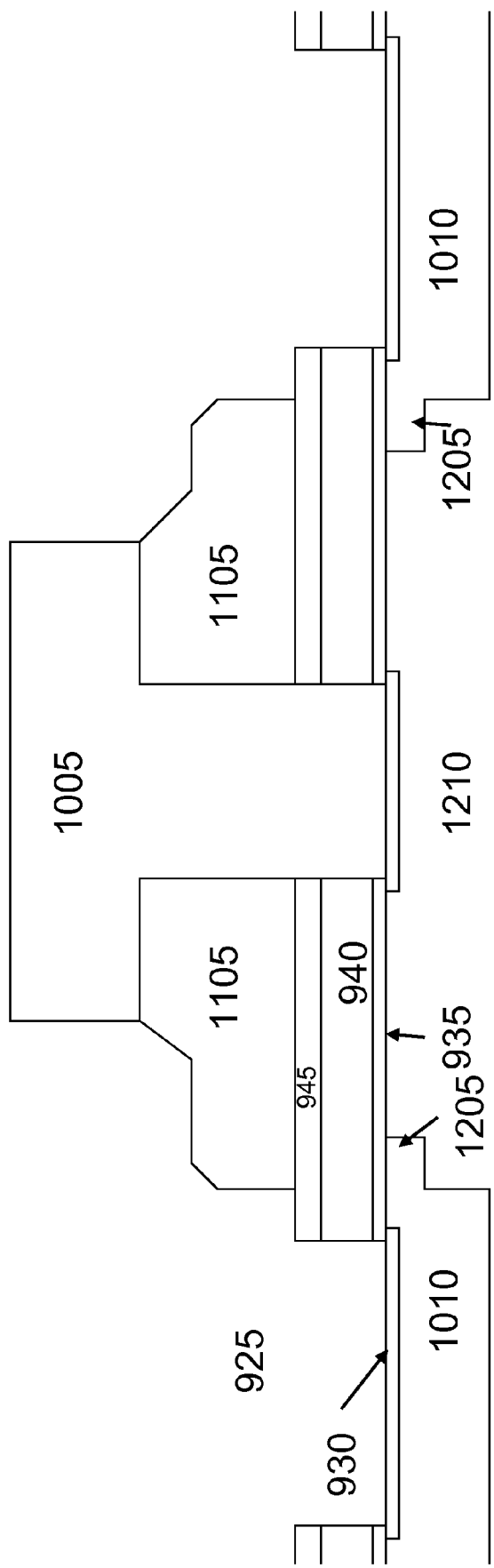

FIG. 12 illustrates the result after the channel boron implant has been made, that should uniformly affect the threshold voltage of the device.

Figure 13:
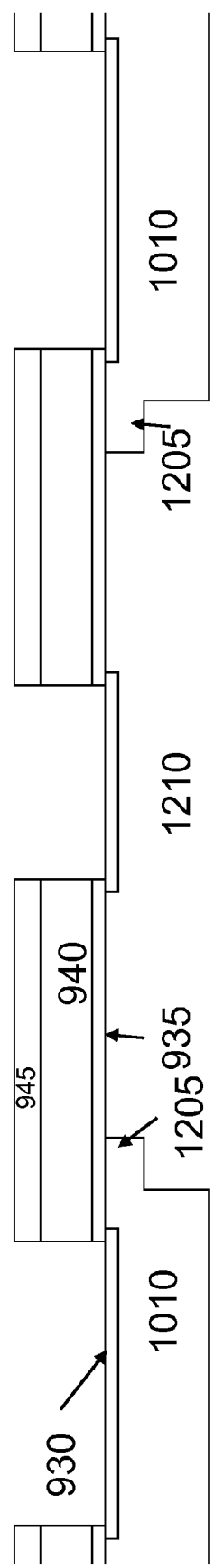

FIG. 13 illustrates the structure after both masks are removed.

Figure 14:
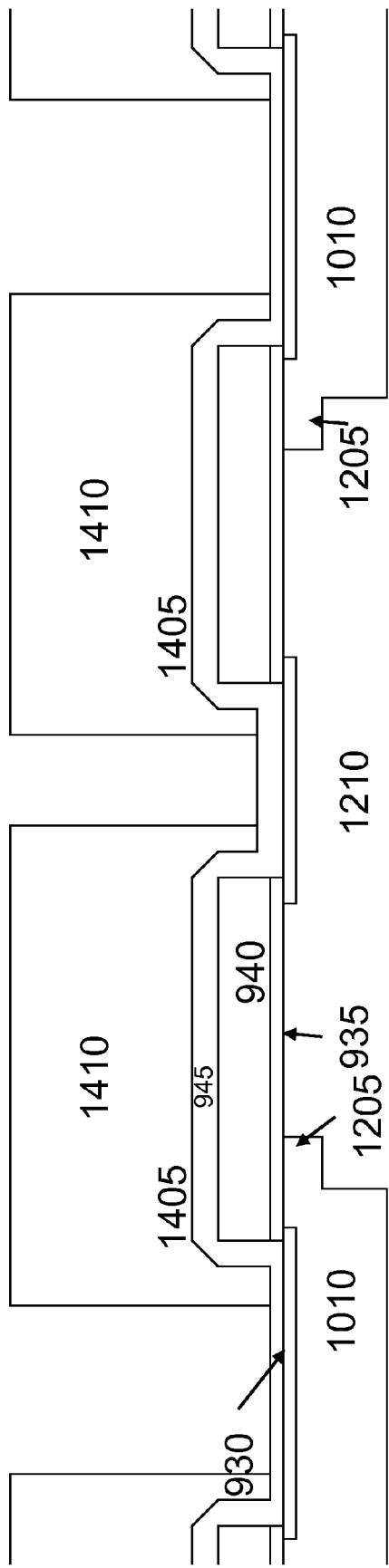

FIG. 14 illustrates the structure once the insulating oxide is deposited and an insulation mask is placed on top.

Figure 15:
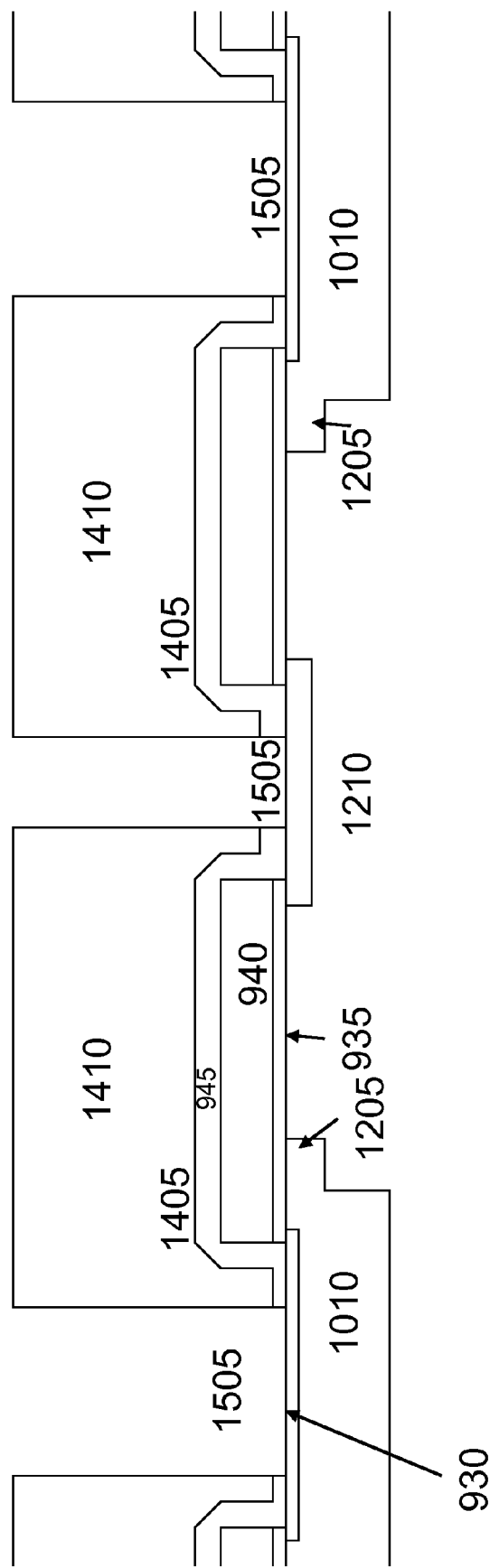

FIG. 15 depicts the structure once a vertical oxide etch is performed.

Figure 16:
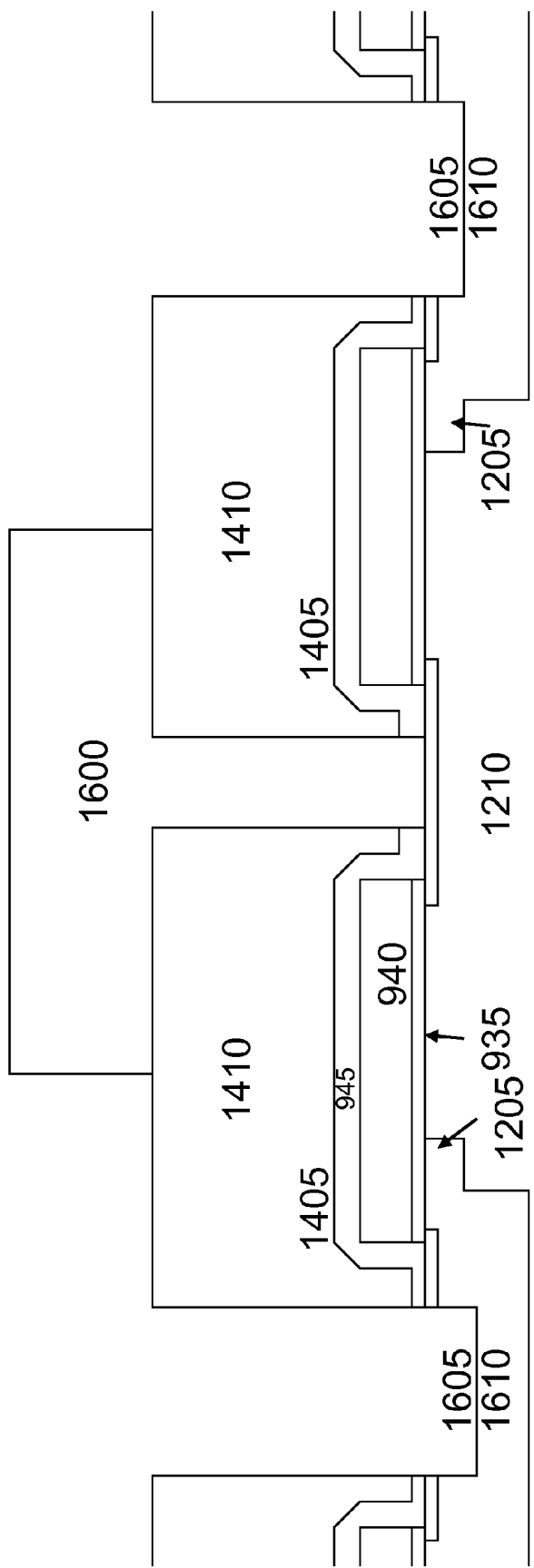

FIG. 16 illustrates the structure after a probe mask is placed to cover the probe contact and a trench is etched to provide contact to the P-well.

Figure 17:
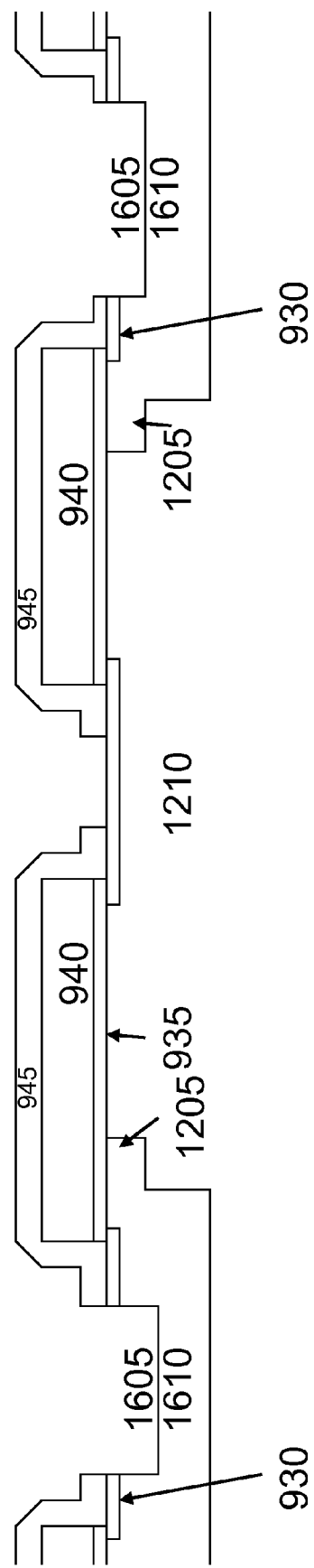

FIG. 17 illustrates the structure after the photoresist is removed and the structure is ready for multilayer metallization.

Figure 18:
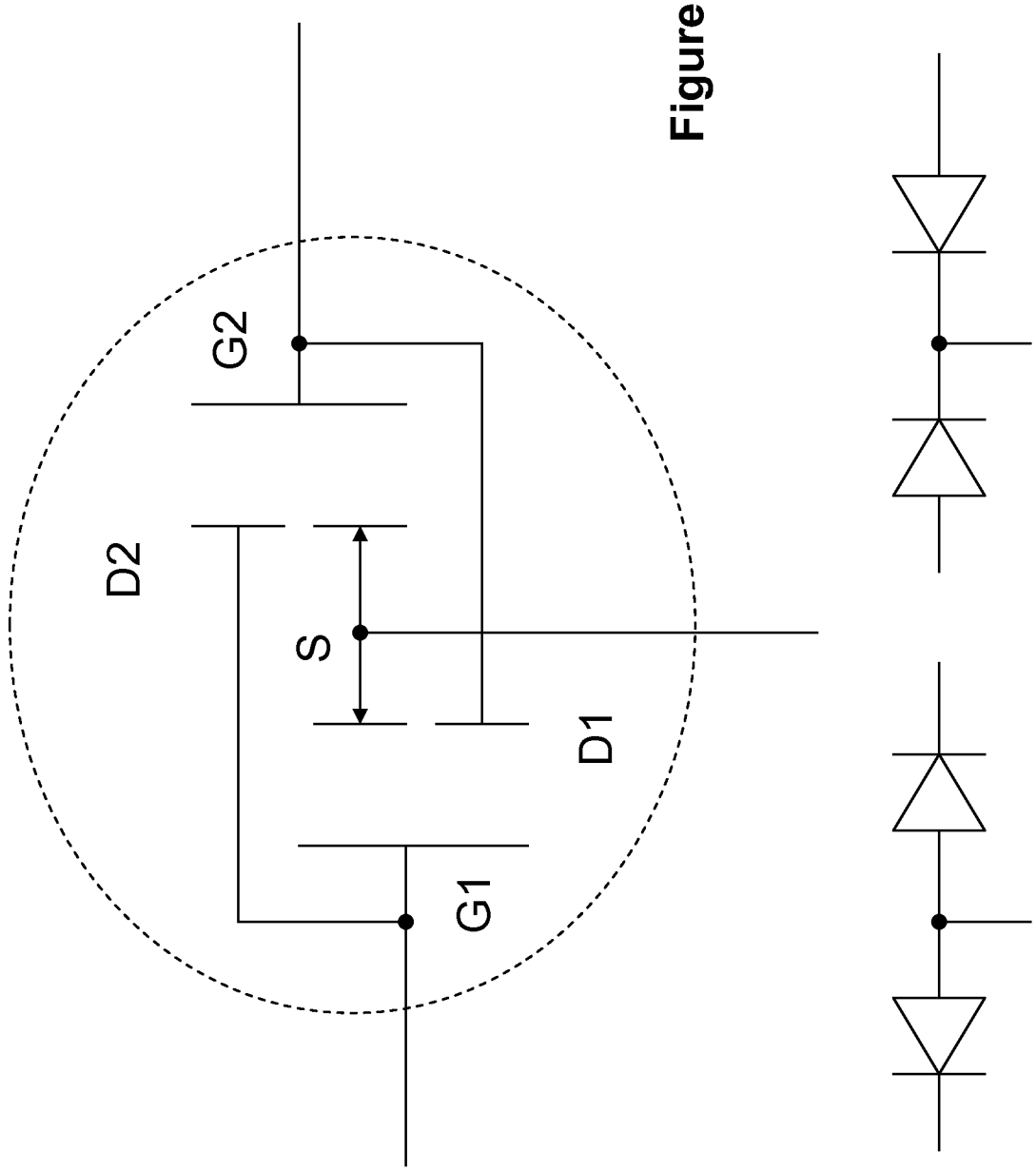

FIG. 18 schematically depicts a regenerative half bridge with common anode (cathode) made from two n-type (p-type) MOSFETs, configured to have the drain voltage applied to the gate. This configuration provides automatic switching between ON and OFF states during operation.

FIG. 19 schematically depicts a regenerative half bridge made using one RBB and one MOSFET.

DETAILED DESCRIPTION OF THE INVENTION

The present invention comprises a new device which can be thought of as a regenerative building block (RBB), and methods of manufacture therefore. In an embodiment, the device is particularly suited to fabrication of devices such as half bridge and full bridge rectifiers. Although those skilled in the art will quickly recognize that the present invention can be used to create a variety of semiconductor devices, for purposes of clarity the present invention will be described in the context of a bridge rectifier, both as a device and as a method of manufacture.

Figure 1:
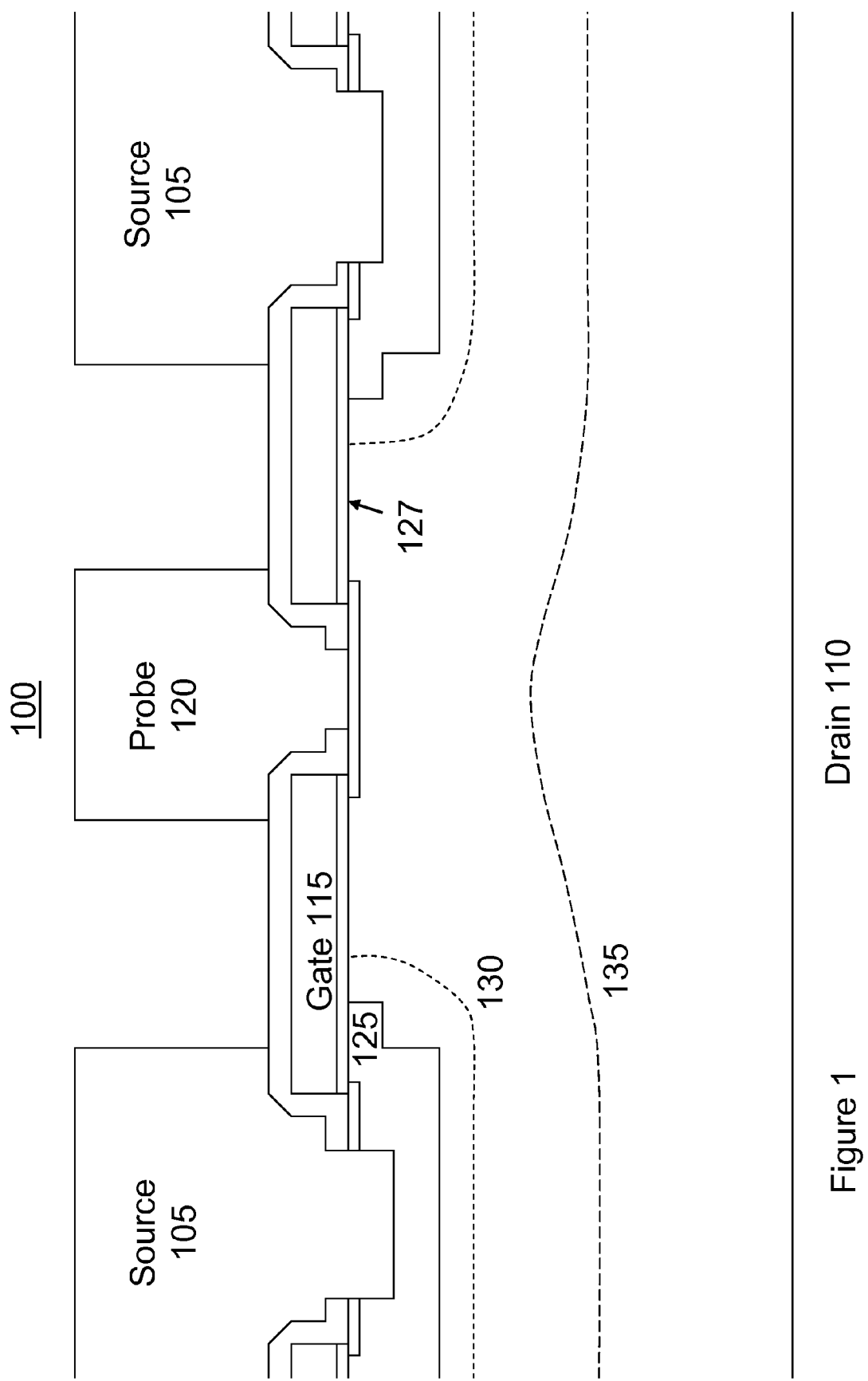
Figure 2:
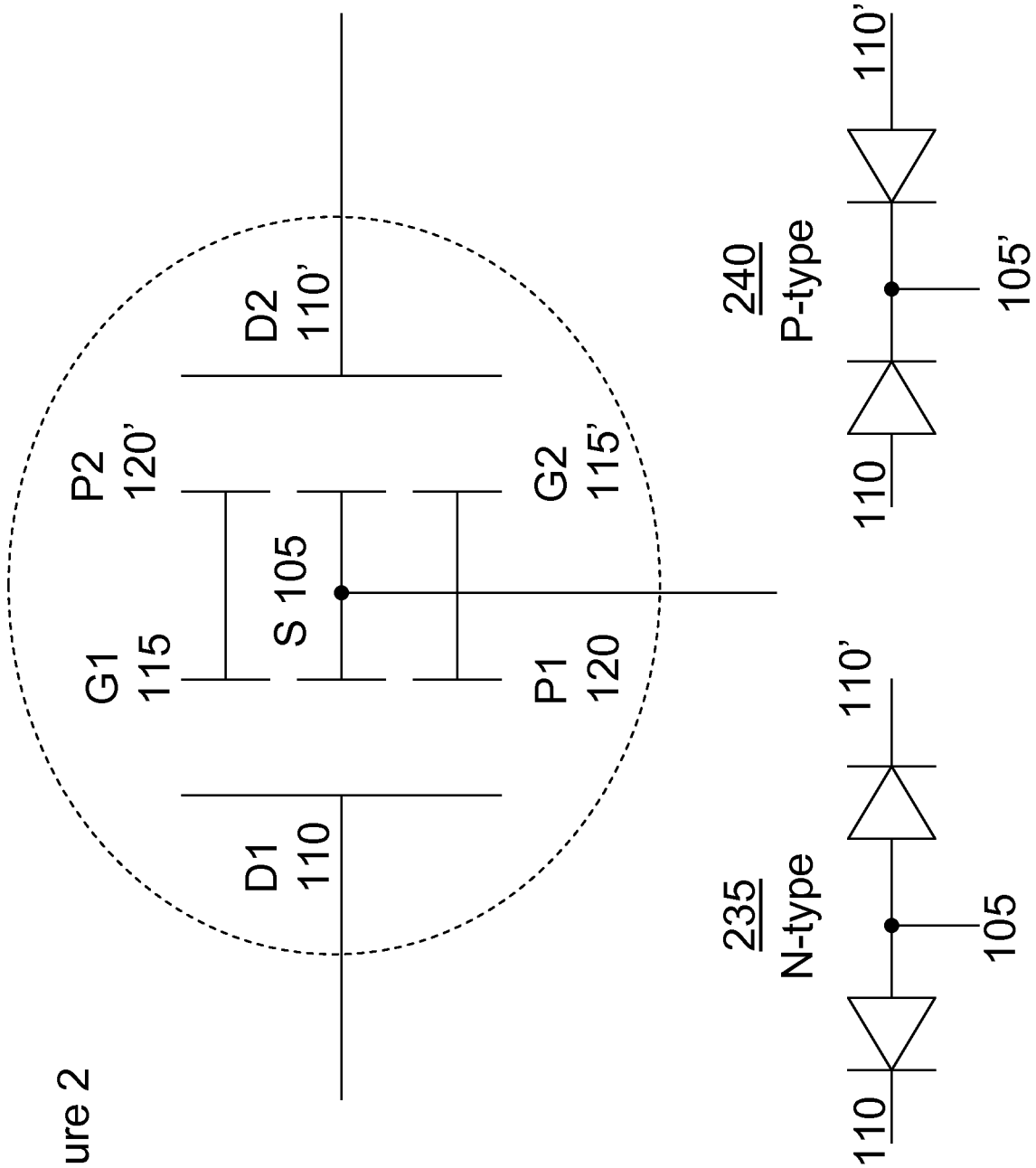

Referring first to FIGS. 1 and 2, the RBB structure indicated generally at 100 is shown both in terms of its physical structure (FIG. 1) and its schematic representation in a pair configured as a half bridge rectifier (FIG. 2). As shown in FIG. 1, the RBB 100 has four electrodes: source 105, drain 110, gate 115 and probe 120. The main current flows between the source and drain electrodes. The gate voltage controls the conductivity of the narrow channel 125 under MOS gate 115 and can switch the RBB between OFF and ON states. The transition from ON to OFF happens at the threshold voltage, which can be adjusted either by using a doping profile under the gate or by changing the thickness of the gate oxide 127. In at least some embodiments, the main purpose of the probe electrode 120 is to extract a regenerative signal, which can be used as a gate control signal for another semiconductor device, such as another RBB or MOSFET.

When the RBB 100 is in the ON state, the voltage drop between source 105 and drain 110 is small, leading to a small probe signal at 120. In the OFF state, the depletion layer boundary changes with the voltage applied between the source and drain. For the small applied voltage the depletion layer boundary 130 is located between the probe 120 and the source 105, and typically ends under the gate for a small applied voltage. In this state, the probe can be thought of in a practical sense as being essentially shorted to the drain, and the probe voltage follows the drain voltage. However for the large applied voltage the depletion layer boundary 135 extends beyond the probe electrode, the probe voltage is almost constant and is almost independent of the drain voltage. This makes the probe voltage attractive as a regenerative signal that can signal other devices whether the RBB 100 is in ON or OFF state. The maximum probe voltage can be adjusted at least by modifying the geometry (e.g. width) of the Probe contact 120 or by changing the doping profile under the Probe contact.

Turning more specifically to FIG. 2, this figure shows how two RBB's 100 can be combined to make regenerative half bridge. The gate electrode 115 of each RBB is controlled by a regenerative signal from the probe contact 120 (and 120') of the other RBB. Note that the resulting regenerative half-bridges have only 3 external contacts, at the common source 105 (and 105'), and each drain 110 and 110', as if they were made out of regular diodes. This allows for substantially pin-for-pin replacement of diode bridges, but without the low voltage limitation of the prior art, and also without the need for the complex control circuitry characteristic of prior art synchronous rectifiers.

The RBB 100 can be n-type or p-type depending on the choice of the epitaxial layer doping. Each RBB has an intrinsic body diode, and for application in circuits typically replaces a diode with the same polarity. Thus two N-type RBB's can be combined into a common anode half-bridge 235, and two P-type RBBs make common cathode half-bridge 240, as shown at the bottom of FIG. 2. During the half-bridge operation one of the devices stays ON while the other is OFF. The regenerative signal from the OFF device has the right sign to help the other device to stay ON.

In an embodiment, the thickness of the gate oxide and the doping in the channel region are carefully managed to optimize device performance. In addition, N++ doping in the probe opening is preferred over P++ doping in at least some embodiments.

Figure 3:
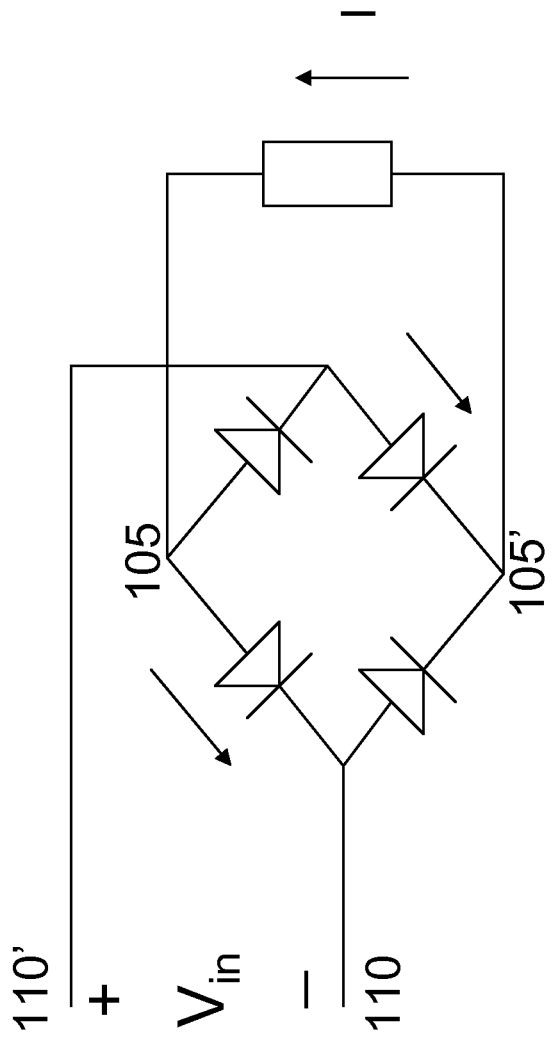
Figure 4:
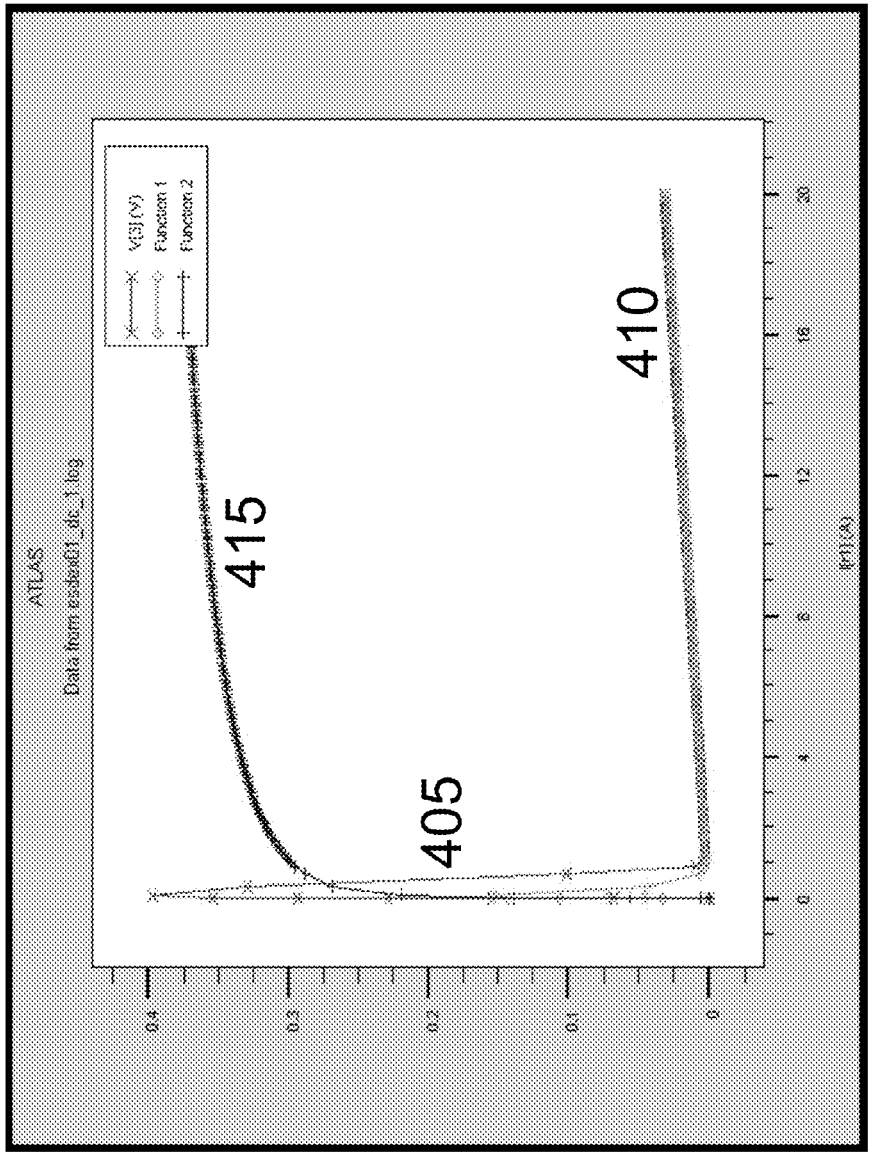

In testing the design shown in FIGS. 1 and 2, a full bridge was tested as shown in FIG. 3, and was configured from common cathode and common anode half bridges as shown in FIG. 2. The test results are shown on FIG. 4. More specifically, the I-V curve of FIG. 4 is for a 10 A, 20V bridge, and shows the forward voltage on a diode (vertical axis) vs. voltage applied to the bridge. By using a 1 ohm load resistor, the current on the horizontal axis is practically equal to the full bridge input voltage. Forward voltage on a diode at 10 A current (200 A/cm$^2$ current density for the n-type device, and 67 A/cm$^2$ for the p-type) is less than 0.05V. The curve 405 shows the result for the n-type device (used in common anode part of the full bridge) and the curve 410 shows the result for the p-type device (used in common cathode half bridge). The region 415 with the negative differential resistance corresponds to the device transition from OFF to ON state. Notice that at zero applied voltage all four RBB devices are in the OFF state. They stay in the OFF state during reverse bias, and automatically go to the ON state when the forward bias reaches approximately 0.5V. The typical leakage of corresponding devices in the OFF state is on the order of 60 μA and 160 μA. Leakage can be reduced at the expense of higher VF by changing the doping concentration under the MOS gate or by changing the geometrical parameters of the structure.

Figure 5:
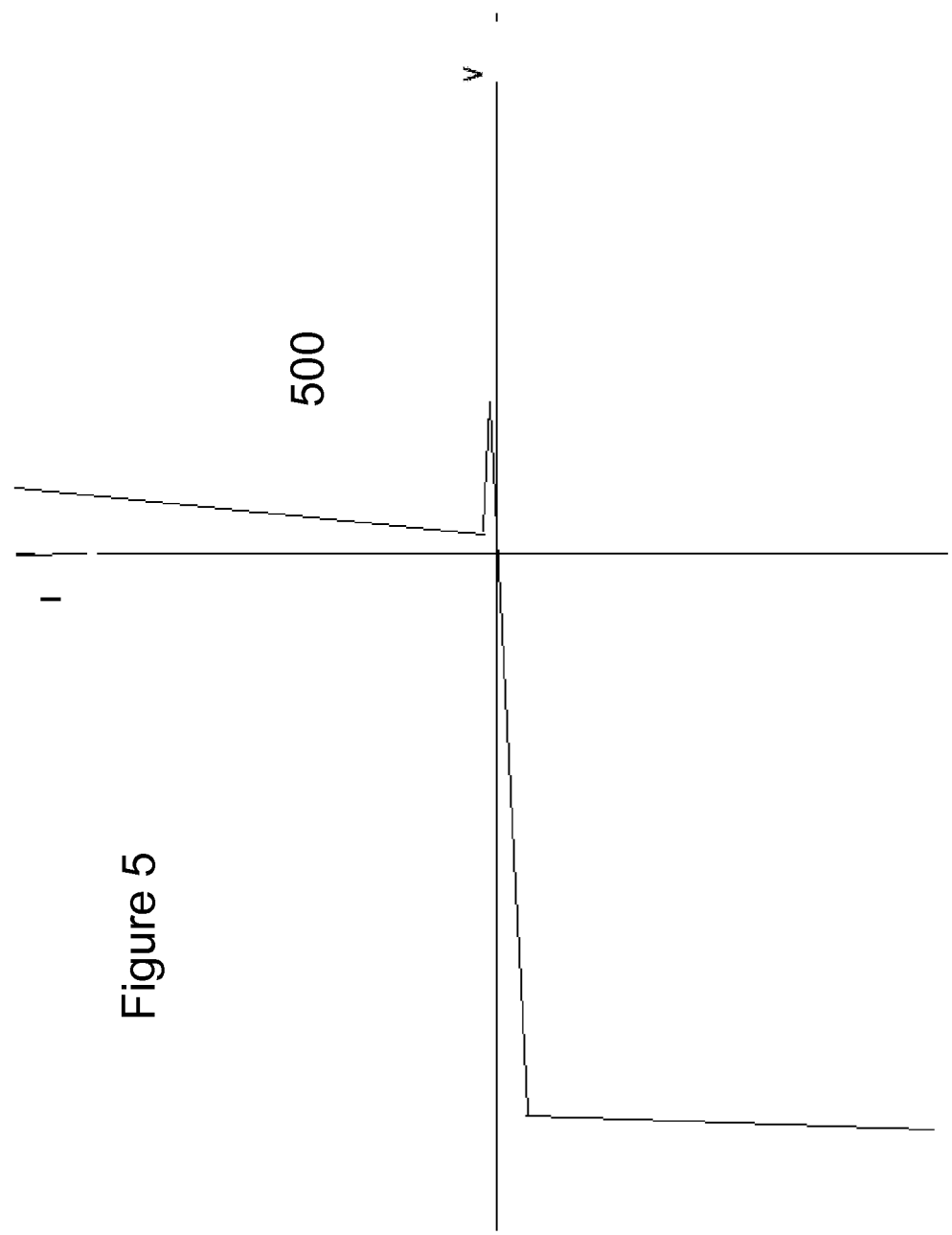
FIG. 5 illustrates a schematic I-V curve for regenerative half-bridges in accordance with the invention. The negative resistance region corresponds to the automatic switching from OFF to ON state, when the gate voltage exceeds the threshold voltage.

The schematic I-V curve for our device operation in all quadrants is shown at 500 in FIG. 5. It looks like a regular diode I-V curve, except for the negative resistance region, which is a result of device physics. The shape of the curve as a whole, including the negative resistance region, depends on geometry and the doping concentrations of the constituent RBB's and therefore is adjustable for an individual RBB.

It can therefore be appreciated that the performance characteristics of this bridge are similar to the one that can be made with synchronous rectifiers, but the device of the present invention does not need either a controller or the circuit associated with the controller implementation typically required of synchronous rectifiers. The transient behavior of the RBB's 100 can be optimized to provide maximum frequency operation with minimum EMI by changing doping profiles and devices geometries, including particularly channel boron dosage, gate oxide thickness, and the width of the probe opening. The transient behavior typically is impacted by the gate capacitance, since carriers are accumulated under the gate during forward bias. The gate oxide on the RBB can be thinned, or, as discussed hereinafter, removal of part of the gate during processing assists in compensating for any capacitance increase. From the foregoing, it can be appreciated that the regenerative half bridges of the present invention do not need additional circuit elements and, due to their improved performance relative to the art, also permit increased frequency of operation.

Figure 6:
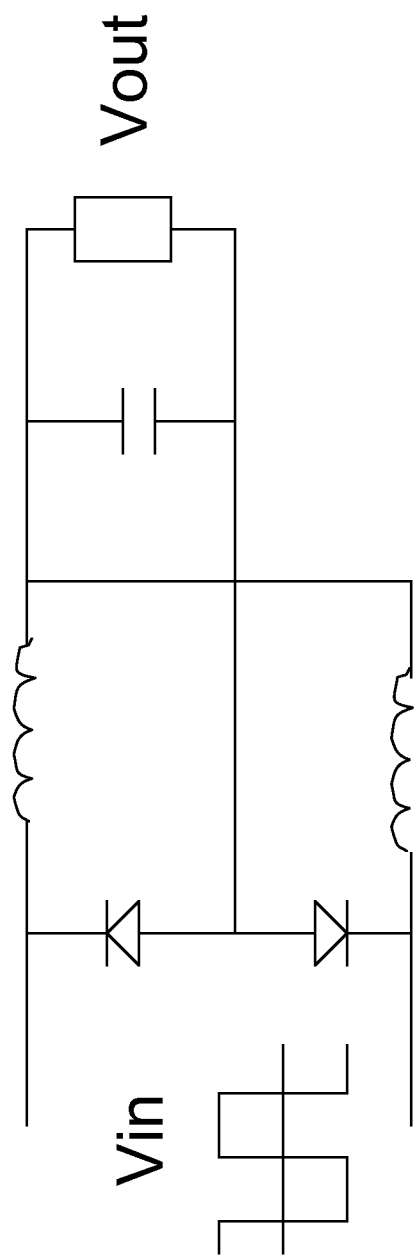
FIG. 6 depicts a regenerative Half Bridge Current doubler rectification design.

The dynamic behavior of the common anode half bridge has been tested for the current doubler rectification circuit shown in FIG. 6. This circuit can be used for the output signal rectification and filtering in several switch mode power supply topologies. Typical waveforms for current 705 and voltage 710 are shown on FIG. 7 for one cycle of operation. The forward and reverse recoveries do not exhibit significant spikes. Details of reverse recovery are shown on FIG. 8, demonstrating that transient time is small. Voltage is shown by curve 805, and current is shown by curve 810.

One possible way to manufacture the RBB is described below in FIGS. 9-17. Those skilled in the art will recognize numerous alternative approaches, and thus the present invention is not limited to the specific method of manufacture described hereinafter. In addition, isolation of the device is desirable in at least some embodiments, and such isolation, if desired, can be achieved by use of a guard ring structure, isolators, or other structures, depending upon the application. These structures are well known in the art, and so are not described here. Further, it is desirable, in at least some embodiments, to have the MOS channel area be uniform throughout the device. One approach for achieving this is to use a self-aligning processing as discussed below.

First, an epitaxial layer 900 is grown on a substrate 910. The doping concentration (N- or P-type) and thickness of this epitaxial layer depends on the breakdown voltage and the desired device type. For the sake of clarity, the following discussion describes the process for an N-type device, which is complementary to the P-type process.

Following the growth of the epitaxial layer 900 a gate oxide 935 on the order of 30-200 A is made, followed by fabricating a layer 940 of Polysilicon on the order of 600-1200 A. Then, an insulating oxide layer 945 is laid down, on the order of 50-1500 A thick. The gate mask 950 is then developed, followed by vertically etching the insulating oxide, polysilicon and gate oxide. Contacts for the source and probe 930 electrodes are made using As implantation through the opening 925. The structure at this stage is shown in FIG. 9.

As shown in FIG. 10, a second Probe mask 1005 is then made on top of the Gate mask, using any suitable method such as silicon nitride or other material. This mask arrangement provides self-alignment and results in uniform barrier heights in the MOS channel area. The P-well boron 1010 is also implanted. For at least some embodiments, the dose of P-well boron is preferably high enough to restrict the main current flow through the channel area.

The Gate mask is isotropically etched as shown in FIG. 11 at 1105. This provides a self-aligned mask for the channel boron implantation 1205, as shown in FIG. 12. The Probe mask is also etched at this stage, and typically covers the adjustment area indicated at 1210.

Next, as shown in FIG. 13, the Gate and Probe masks are removed, and an insulating oxide 1405 is deposited and an insulation mask 1410 is placed on top as shown in FIG. 14. Then, as shown in FIG. 15, the insulating oxide is etched as indicated at 1505 to provide contacts to the probe and source electrodes.

Then, a Probe mask 1600 is placed on top of the insulation mask. A trench 1605 shown in FIG. 16 is vertically etched in silicon to provide contact to the P-well, and a P-type implant 1610 is performed to provide ohmic contact for the Source electrode. Otherwise, in some embodiments, the charge in the P-well will be changed by the hole current that flows to the anode through the P-wells of the guard ring structure. This may slow down device operation, unless the distance to the guard ring's P-well is small enough. Notice that there is still a good ohmic contact for the electron flow, since most of the electron current is flowing through the narrow channel under the gate.

Referring next to FIG. 17, removal of the photoresist concludes the active area processing. Multilayer metallization is then performed in a conventional manner as for MOSFET devices, and is therefore not shown, such that three contact areas are created on the top surface of the chip to conclude the RBB manufacturing process and yield the device shown in FIG. 1.

In principal it is not always necessary to use RBB to make regenerative half bridges or diodes. For example, for the low breakdown voltage devices the full drain voltage can be used as a probe voltage. Then regenerative half bridges can be made from 2 MOSFETs (FIG. 18) or from a combination of RBB and MOSFET (FIG. 19). Notice, that to operate at small voltages the MOSFET should have small threshold voltage and therefore small gate oxide thickness. Thus, for embodiments designed for handling significant power, practically one cannot apply full drain voltage to the low threshold gate, since the thin gate oxide might be damaged and the device destroyed. For lower power devices, such as those incorporated into integrated circuits, which typically have all three terminals on the top surface, full drain voltage can be applied to the gate in many embodiments.

Having fully described a preferred embodiment of the invention and various alternatives, those skilled in the art will recognize, given the teachings herein, that numerous alternatives and equivalents exist which do not depart from the invention. It is therefore intended that the invention not be limited by the foregoing description, but only by the appended claims.

We claim:

1. A semiconductor device operable as a half bridge, the semiconductor device comprising:
    a first metal-oxide-semiconductor (MOS) component comprising a first gate region, a first source region, a first drain region, and a first probe region, wherein the first MOS component is arranged such that, in response to the first MOS component being reverse-biased between the first source region and the first drain region, the first probe region produces a first signal indicating the reverse-biased state;
    a second MOS component comprising a second gate region, a second source region, a second drain region, and a second probe region, wherein the second MOS component is arranged such that, in response to the second MOS component being reverse-biased between the second source region and the second drain region, the second probe region produces a second signal indicating the reverse-biased state;

a first drain contact operatively coupled to the first drain region;

a second drain contact operatively coupled to the second drain region; and a first source contact operatively coupled to the first source region and the second source region, wherein the semiconductor device is arranged such that a conductivity of the second MOS component is controlled based at least in part on the first signal and a conductivity of the first MOS component is controlled based at least in part on the second signal.

2. The semiconductor device of claim 1, wherein the first MOS component comprises an opening formed in the first gate region, and wherein the first probe region is formed in the opening.

3. The semiconductor device of claim 2, wherein the second MOS component comprises a second opening formed in the second gate region, and wherein the second probe region is formed in the second opening.

4. The semiconductor device of claim 2, wherein the first probe region is directly coupled to the second gate region and the second probe region is directly coupled to the first gate region.

5. The semiconductor device of claim 2, wherein the first probe region comprises a heavily-doped semiconductor material.

6. The semiconductor device of claim 5, wherein the heavily-doped semiconductor material of the first probe region is of a same conductivity type as the first source region.

7. The semiconductor device of claim 1, wherein the first MOS component and the second MOS component are of a same conductivity type.

8. The semiconductor device of claim 1, wherein, when the semiconductor device is operated, the first MOS component controls the conductivity of the second MOS component via a regenerative signal provided from the first probe region to the second gate region, the first signal being the regenerative signal.

9. The semiconductor device of claim 8, wherein, when the semiconductor device is operated, the second MOS component controls the conductivity of the first MOS component via a second regenerative signal provided from the second probe region to the first gate region, the second signal being the second regenerative signal.

10. The semiconductor device of claim 1, wherein, when the semiconductor device is operated, the first probe region outputs the first signal indicating whether the first MOS component is conductive or nonconductive when the first MOS component is reverse-biased.

11. The semiconductor device of claim 1, wherein the semiconductor device is a half-bridge rectifier.

12. The semiconductor device of claim 11, wherein the semiconductor device is a three-terminal half-bridge rectifier having one input terminal and two output terminals, the one input terminal being coupled to the first source contact, a first output terminal being coupled to the first drain contact, and the second output terminal being coupled to the second drain contact.

13. The semiconductor device of claim 11, wherein the semiconductor device is a three-terminal half-bridge rectifier having two input terminals and one output terminal, a first input terminal being coupled to the first drain contact, a second input terminal being coupled to the second drain contact, and the one input terminal being coupled to the first source contact.

14. A metal-oxide-semiconductor (MOS) device comprising:

a gate region;

an opening formed in the gate region;

a probe region formed in the opening;

a gate electrode coupled to the gate region; and a probe electrode coupled to the probe region, wherein the probe electrode is different from the gate electrode, wherein the MOS device is arranged such that, during operation, in response to the MOS device being reverse-biased between a source region and a drain region of the MOS device, the probe electrode outputs a signal indicating the reverse-biased state.

15. The MOS device of claim 14, further comprising:

a source electrode coupled to the source region; and a drain electrode coupled to the drain region.

16. The MOS device of claim 14, wherein the probe electrode is arranged to output, during operation of the MOS device, a signal indicating a conductivity of the MOS device.

17. The MOS device of claim 16, wherein the MOS device is arranged such that, during operation of the MOS device, when the MOS device is reverse-biased between the source region and the drain region of the MOS device at a first voltage, the signal output by the probe electrode follows a voltage at the drain region and, when the MOS device is reverse-biased between the source region and the drain region of the MOS device at a second voltage higher than the first voltage, the signal output by the probe electrode is independent of a voltage at the drain region.

18. The MOS device of claim 17, wherein the MOS device is arranged such that a voltage level of the signal output by the probe electrode is nearly constant when a source-to-drain voltage meets or exceeds the second voltage.

19. The MOS device of claim 16, wherein the signal output by the first probe electrode is a regenerative signal.

20. The MOS device of claim 14, wherein the probe region comprises a heavily-doped semiconductor material.

21. The MOS device of claim 20, wherein the heavily-doped semiconductor material of the probe region is of a same conductivity type as the source region.

22. The MOS device of claim 14, further comprising an epitaxial layer, wherein the probe region is formed in the epitaxial layer.

23. The MOS device of claim 14, further comprising an insulating region to insulate the gate electrode from the probe electrode.

24. A semiconductor device comprising:

a first metal-oxide-semiconductor (MOS) component comprising a first gate region, a first source region, a first drain region, and a first probe region; and a second MOS component comprising a second gate region, a second source region, a second drain region, and a second probe region;

wherein a first voltage level of the first gate region follows a second voltage level of the second probe region and a third voltage level of the second gate region follows a fourth voltage level of the first probe region, and wherein the second voltage level of the second probe region is set based on whether relative voltage values of the second drain region and the second source region make the second MOS component conductive and the fourth voltage level of the first probe region is set based on whether relative voltage values of the first drain region and the first second region make the first MOS component conductive.

25. The semiconductor device of claim 24, wherein the semiconductor device is a three-terminal device having three terminals, wherein a first terminal is coupled to the first source region and the second source region, a second terminal is coupled to the first drain region, and a third terminal is coupled to the second drain region.

26. The semiconductor device of claim 24, wherein the first MOS component comprises an opening formed in the first gate region, and
wherein the first probe region is formed in the opening.

27. The semiconductor device of claim 26, wherein the second MOS component comprises a second opening formed in the second gate region, and
wherein the second probe region is formed in the second opening.

28. The semiconductor device of claim 24, wherein the first probe region is directly coupled to the second gate region and the second probe region is directly coupled to the first gate region.

29. The semiconductor device of claim 24, wherein a fifth voltage level at the first source region follows a sixth voltage level at the second source region.

30. The semiconductor device of claim 24, wherein the semiconductor device is arranged such that the first MOS component is able to control a conductivity of the second MOS component and the second MOS component is able to control a conductivity of the first MOS component.

31. The semiconductor device of claim 30, wherein, when the semiconductor device is operated, the first MOS component controls the conductivity of the second MOS component via a regenerative signal provided from the first probe region to the second gate region.

32. The semiconductor device of claim 24, wherein the first MOS component and the second MOS component are of a same conductivity type.

33. The semiconductor device of claim 24, wherein, when the semiconductor device is operated, the first probe region outputs a signal indicating whether the first MOS component is conductive or nonconductive.

34. The semiconductor device of claim 24, wherein the semiconductor device is a half-bridge rectifier.

35. A semiconductor device comprising:
a first metal-oxide-semiconductor (MOS) component comprising a first gate region, a first source region, a first drain region, and a first probe region; and
a second MOS component comprising a second gate region, a second source region, a second drain region, and a second probe region;
wherein the first probe region is arranged to control a conductivity of the second MOS component based on whether the first MOS component is reverse-biased and the second probe region is arranged to control a conductivity of the first MOS component based on whether the second MOS component is reverse-biased.

36. The semiconductor device of claim 35, wherein the first probe region is arranged to control a conductivity of the second MOS component based on whether the first MOS component is reverse-biased between the first source region and the first drain region, and
the second probe region is arranged to control a conductivity of the first MOS component based on whether the second MOS component is reverse-biased between the second source region and the second drain region.

37. The semiconductor device of claim 35, wherein the semiconductor device is a three-terminal device having three terminals, wherein a first terminal is coupled to the first source region and the second source region, a second terminal is coupled to the first drain region, and a third terminal is coupled to the second drain region.

38. The semiconductor device of claim 35, wherein the first MOS component comprises an opening formed in the first gate region, and
wherein the first probe region is formed in the opening.

39. The semiconductor device of claim 38, wherein the second MOS component comprises a second opening formed in the second gate region, and
wherein the second probe region is formed in the second opening.

40. The semiconductor device of claim 35, wherein the first probe region is directly coupled to the second gate region and the second probe region is directly coupled to the first gate region.

41. The semiconductor device of claim 35, wherein the first source region and the second source region are arranged to maintain a same voltage level.

42. The semiconductor device of claim 35, wherein the first probe region is arranged to output a first signal when a voltage level of the first drain region exceeds a voltage level of the first source region, and
wherein the second MOS component is arranged in the semiconductor device such that the conductivity of the second MOS component is set based at least in part on the first signal.

43. The semiconductor device of claim 42, wherein the second probe region is arranged to output a second signal when a voltage level of the second drain region exceeds a voltage level of the second source region, and
wherein the first MOS component is arranged in the semiconductor device such that the conductivity of the first MOS component is set based at least in part on the second signal.

44. The semiconductor device of claim 42, wherein, when the semiconductor device is operated, the first MOS component controls the conductivity of the second MOS component via a regenerative signal provided from the first probe region to the second gate region, the first signal being the regenerative signal.

45. The semiconductor device of claim 35, wherein the first MOS component and the second MOS component are of a same conductivity type.

46. The semiconductor device of claim 35, wherein, when the semiconductor device is operated, the first probe region outputs a signal indicating whether the first MOS component is conductive or nonconductive.

47. The semiconductor device of claim 35, wherein the semiconductor device is a half-bridge rectifier.

* * * * *